United States Patent
Robinson

(10) Patent No.: US 12,153,080 B2
(45) Date of Patent: *Nov. 26, 2024

(54) PANEL FOR AUDIBLE MONITORING OF ELECTRICAL COMPONENTS AND THE DETECTION OF ELECTRICAL FAULTS

(71) Applicant: IRISS Holdings, Inc., Bradenton, FL (US)

(72) Inventor: Martin Robinson, Bradenton, FL (US)

(73) Assignee: IRISS Holdings, Inc., Bradenton, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/369,740

(22) Filed: Sep. 18, 2023

(65) Prior Publication Data
US 2024/0003956 A1  Jan. 4, 2024

Related U.S. Application Data

(63) Continuation of application No. 17/961,422, filed on Oct. 6, 2022, now Pat. No. 11,762,005, which is a continuation of application No. 17/228,630, filed on Apr. 12, 2021, now Pat. No. 11,480,600, which is a continuation of application No. 16/607,651, filed as
(Continued)

(51) Int. Cl.
*G01R 31/08* (2020.01)
*H05K 5/02* (2006.01)

(52) U.S. Cl.
CPC ............ *G01R 31/086* (2013.01); *H05K 5/02* (2013.01)

(58) Field of Classification Search
USPC ........................................................ 324/500
See application file for complete search history.

(56) References Cited

U.S. PATENT DOCUMENTS

| | | |
|---|---|---|
| 1,642,698 A | 9/1927 | Rohn |
| 3,404,316 A | 10/1968 | Jacobs |
| 6,220,098 B1 | 4/2001 | Johnson |
| (Continued) | | |

FOREIGN PATENT DOCUMENTS

| | | |
|---|---|---|
| CN | 201213200 | 3/2009 |
| CN | 202171504 | 3/2012 |
| (Continued) | | |

OTHER PUBLICATIONS

Examination Report issued in IN 201917044017, May 2, 2022.
(Continued)

*Primary Examiner* — Farhana A Hoque
(74) *Attorney, Agent, or Firm* — Akerman LLP

(57) ABSTRACT

Embodiments of the present disclosure may enable an electrical component within an electrical distribution equipment cabinet to be audibly monitored via an electrical fault detection device mounted on the housing of the cabinet. The electrical fault detection device may comprise a senor to detect a signal emitted from an electrical fault within the cabinet, a transducer to convert the detected signal into an electrical audio signal, and an output socket adapted for an external device that may generate an audible sound based on the detected signal. The detected sensor may be an ultrasound sensor and the detected signal may be an ultrasound emitted from the electrical fault.

19 Claims, 11 Drawing Sheets

Related U.S. Application Data application No. PCT/US2018/029050 on Apr. 24, 2018, now Pat. No. 10,983,156.

(60) Provisional application No. 62/489,874, filed on Apr. 25, 2017.

(56) References Cited

U.S. PATENT DOCUMENTS

| | | |
|---|---|---|
| 6,247,353 B1 | 6/2001 | Battenberg et al. |
| 6,547,348 B2 | 4/2003 | Craft et al. |
| 6,616,005 B1 | 9/2003 | Pereira |
| 6,758,353 B2 | 7/2004 | Orr |
| 6,798,587 B2 | 9/2004 | Irani |
| 7,079,334 B2 | 7/2006 | Holliday et al. |
| 7,209,042 B2 | 4/2007 | Martin et al. |
| 7,295,133 B1 | 11/2007 | McCollough, Jr. |
| 7,327,558 B2 | 2/2008 | Kennedy et al. |
| 7,336,153 B2 | 2/2008 | Malone et al. |
| 7,432,818 B2 | 10/2008 | Ray |
| 8,023,818 B2 | 9/2011 | Schmidt et al. |
| 8,052,231 B2 | 11/2011 | Rasmussen et al. |
| 8,164,827 B2 | 4/2012 | Robinson |
| 8,258,928 B2 | 9/2012 | Tseng |
| 8,400,708 B2 | 3/2013 | Robinson |
| 8,407,938 B2 | 4/2013 | Faria |
| 8,421,629 B2 | 4/2013 | Carr |
| 8,500,271 B2 | 8/2013 | Howell et al. |
| 8,931,952 B2 | 1/2015 | Langdoc et al. |
| D727,326 S | 4/2015 | Sullivan et al. |
| 9,032,211 B2 | 5/2015 | Arunan et al. |
| 9,044,832 B2 | 6/2015 | Sullivan et al. |
| 9,154,712 B2 | 10/2015 | Holliday |
| 9,594,109 B2 | 3/2017 | Stock et al. |
| 10,983,156 B2 | 4/2021 | Robinson |
| 11,480,600 B2 | 10/2022 | Robinson |
| 2002/0153338 A1 | 10/2002 | Orr |
| 2003/0020027 A1 | 1/2003 | Danvers |
| 2004/0120109 A1 | 6/2004 | Kennedy |
| 2006/0141921 A1 | 6/2006 | Turek et al. |
| 2009/0178991 A1 | 7/2009 | Rasmussen et al. |
| 2010/0000953 A1 | 1/2010 | Shew et al. |
| 2010/0014152 A1 | 1/2010 | Robinson |
| 2010/0107496 A1 | 5/2010 | Faria |
| 2010/0201230 A1 | 8/2010 | Schweitzer, III et al. |
| 2011/0073726 A1 | 3/2011 | Bergesch |
| 2011/0083824 A1 | 4/2011 | Rogers |
| 2012/0049706 A1 | 3/2012 | Cottuli et al. |
| 2012/0075070 A1 | 3/2012 | Rai et al. |
| 2012/0091090 A1 | 4/2012 | Larsen et al. |
| 2013/0176678 A1 | 7/2013 | Campbell |
| 2014/0144858 A1 | 5/2014 | Yokosawa et al. |
| 2014/0160686 A1 | 6/2014 | Benson et al. |
| 2014/0170971 A1 | 6/2014 | Walsh |
| 2014/0218817 A1 | 8/2014 | Gunell et al. |
| 2015/0060382 A1 | 3/2015 | Drewery et al. |
| 2015/0131177 A1 | 5/2015 | Robinson |
| 2015/0154433 A1 | 6/2015 | Stewart |
| 2015/0177072 A1 | 6/2015 | Murphy et al. |
| 2015/0230354 A1 | 8/2015 | Sullivan |
| 2015/0233999 A1* | 8/2015 | Stock .................. H02H 1/0023 324/511 |
| 2015/0334355 A1 | 11/2015 | Ware et al. |

FOREIGN PATENT DOCUMENTS

| | | |
|---|---|---|
| CN | 202856180 | 4/2013 |
| CN | 203705940 | 7/2014 |
| CN | 203800406 | 8/2014 |
| CN | 204088925 | 1/2015 |
| CN | 204651701 | 9/2015 |
| EP | 2442121 | 6/2016 |
| WO | 2012037575 | 3/2012 |
| WO | 2013021182 | 2/2013 |
| WO | 2015057504 | 4/2015 |
| WO | 2015065376 | 5/2015 |

OTHER PUBLICATIONS

Office Action issued in CN 201880041281.1, Aug. 17, 2021 (English translation).
D.G. Watters, et al., "Design and Performance of Wireless Sensors for Structural Health Monitoring," Menlo Park, CA, Aug. 28, 2003.
Fluke, "Fluke CV401 ClirVu®95 mm (4 in) Infrared Window," U.S., obtained from the Internet on Nov. 3, 2015 at URL: http://en-us.fluke.com/products/ir-windows/fluke-cv401.html.
Startech, "Vented Blank Panel for Server Racks—1U," Startech.com, obtained from the Internet on Nov. 4, 2015 at URL: http://www.startech.com/Server-Management/Racks/1u-vented-rack-panel-RPNLTL1UV.
Startech, "Vented Blank Panel with Hinge for Server Racks—6U," Startech.com, obtained from the Internet on Nov. 4, 2015 at URL: ,http://www.startech.com/Server-Management/Racks/6u-hinged-vented-blanking-panel-R.
International Search Report and Written Opinion for Application No. PCT/US2017/012461, Mar. 17, 2017.
International Search Report and Written Opinion for Application No. PCT/US18/29050, Aug. 3, 2018.
What Is Partial Discharge Testing—Vertiv Insights website shone on website Nov. 30, 2016.
Partial discharge products of IPEC Ltd as shown on website Dec. 30, 2016.
Amperis Partial discharge detector equipment shown on website Mar. 19, 2017.
Extended European Search Report for Patent Application No. EP 18791189.6, Dec. 7, 2020.
Sidhu, Tarlochan S et al., "Multisensor Secondary Device for Detection of Low-Level Arcing Faults in Metal-Clad MCC Switchgear Panel," IEEE Transactions on Power Delivery, vol. 17, No. 1, Jan. 1, 2002.
Examination Report issued in EP 18791189.6, Dec. 16, 2022.
Examination Report issued in BR 112019022298-7, Apr. 24, 2018.
Examination Report issued in AU 2018258236, Mar. 9, 2023.
Examination Report issued in CA 3,061,503, Jan. 18, 2024.

* cited by examiner

PANEL FOR AUDIBLE MONITORING OF ELECTRICAL COMPONENTS AND THE DETECTION OF ELECTRICAL FAULTS

CROSS-REFERENCE TO RELATED APPLICATIONS

This application is a continuation of U.S. patent application Ser. No. 17/961,422, filed Oct. 6, 2022, now U.S. Pat. No. 11,762,005, which is a continuation of U.S. patent application Ser. No. 17/228,630, filed Apr. 12, 2021, now U.S. Pat. No. 11,480,600, which is a continuation of U.S. patent application Ser. No. 16/607,651, filed Oct. 23, 2019, now U.S. Pat. No. 10,983,156, which is a § 371 U.S. national stage application of International Application No. PCT/US2018/029050, filed Apr. 24, 2018, which claims priority to U.S. Provisional Application No. 62/489,874, filed Apr. 25, 2017, all of which are incorporated herein by reference in their entirety.

FIELD OF THE INVENTION

The present disclosure relates in general to the field of cabinets for electrical distribution equipment.

BACKGROUND

Technology for cabinet-based power systems have been described in the following U.S. patents and publications: U.S. Pat. No. 1,642,698; No. 2014/0144858; U.S. Pat. No. 6,758,353; No. 2014/0160686; U.S. Pat. Nos. 3,404,316; 6,547,348; and, 8,052,231. Technology for ultrasound sensors, partial discharge detectors, related-circuitry and headphones for the generation of audible sounds in response to the ultrasonic signals have been described in the U.S. patents and publications: U.S. Pat. No. 5,432,755; No. 2005/0285604; and, No. 2009/0302862. One drawback with certain implementations of monitoring electrical components is the limited accessibility of components' electrical connections within a cabinet. Certain power distribution systems may not be readily monitored due to safety concerns in light of the high voltage of the power source because only competent technicians with specialized training may be permitted to physically access electrical equipment within power cabinets. Due to the location of electrical connections within a housing, a proper inspection may not be possible via inspection windows that are not directly adjacent to targeted components. For example, an infrared camera may not be able to capture accurate temperature measurements if the line of sight for a component/connection is obstructed by other electrical or structural components.

SUMMARY OF THE INVENTION

The present disclosure may be embodied in various forms, including without limitation a device and a method for the monitoring of electrical components located within an electrical distribution equipment cabinet based on the detection of ultrasounds and electrical impulses emitted from an electrical fault. Embodiments of the present disclosure may enable, among other things, the monitoring of electrical components in cabinets without opening and viewing entire racks or cabinets via an electrical fault detection device used to identify early warning signs of equipment insulation failure.

Some embodiments of the present disclosure may include a sensor that is mounted on an interior side of a housing for the electrical distribution equipment cabinet. The housing may enclose the electrical components located within the electrical distribution equipment cabinet. The sensor may detect a signal emitted from an electrical fault within the electrical distribution equipment cabinet. In addition, an output socket may be mounted on the housing for the electrical distribution equipment cabinet. The output socket may be operably connected to the sensor. The output socket may have a front side that defines an opening, which may be mounted on an exterior side of the housing. The opening of the output socket may receive a cable plug for a cable connected to an external device.

The external device may generate an audible sound based on the detected signal. Accordingly, the electrical fault may be audibly monitored by an user of the external device. The electrical fault may comprise a corona, an arcing, a surface tracking and/or a partial discharge of the electrical components. In an embodiment, the sensor may be an ultrasound sensor and the detected signal may be an ultrasound emitted from the electrical fault. The sensor may be a partial discharge detector and the detected signal may be a pulse change or electrical impulse emitted from the electrical fault, in accordance with some embodiments.

In certain embodiments, the sensor of the present disclosure may comprise a transducer that may convert the detected signal to an electrical audio signal. In an embodiment, the transducer may be connected to the sensor via electrical wires. The transducer may be connected to the output socket via electrical wires. The transducer may transmit the electrical audio signal to the output socket. In some embodiments, the sensor may transmit the detected signal to the output socket, and the external device may convert the transmitted signal to an electrical audio signal.

The external device may be a headphone, a headset, or a speaker. In certain embodiments, the external device may connect to an audio device. Accordingly, the audible sound may be generated by the audio device based on the detected signal. In some embodiments, the external device may comprise a screen monitor. The external device may generate a visual representation on the screen monitor based on the detected signal. As a result, the electrical fault may be visually monitored by the user of the external device. The visual representation may comprise partial discharge readings, voltage readings, electrical current readings, sound level readings, and/or sinusoidal wave representations.

In some embodiments, the present disclosure may include a panel mounted on the housing for the electrical distribution equipment cabinet via a retaining mechanism. The retaining mechanism may secure the panel to the electrical distribution equipment cabinet, and may comprise screws and nuts in accordance with certain embodiments. The housing of cabinet may define an opening in the electrical distribution equipment cabinet. The panel may be mounted over the opening. The sensor may be mounted on a first side of the panel. In an embodiment, the opening on the front side of the output socket mounted on a second side of the panel. The first side of the mounted panel may be positioned on the interior side of the cabinet, and the second side of the mounted panel may be positioned on the exterior side of the cabinet.

In an embodiment, the panel may be transparent to radiation emitted from the electrical components. The radiation may comprise infrared radiation and/or ultraviolet radiation. The external device may detect the emitted radiation. The external device may comprise a screen monitor and generate a visual representation on the screen monitor based on the detected radiation. The visual representation may comprise a thermogram. Accordingly, the electrical fault may be visually monitored by an user of the external device.

In an embodiment of the present disclosure, a method for the audible monitoring of electrical components located within an electrical distribution equipment cabinet may comprise the step of detecting, via a sensor, a signal emitted from an electrical fault within the cabinet. The sensor may be mounted on an interior side of a housing for the cabinet. The housing may enclose the electrical components located within the electrical distribution equipment cabinet. The method may further comprise the steps of converting, via a transducer, the detected signal into an electrical audio signal and transmitting, via an output socket, the electrical audible signal to an external device. A front side of the output socket may define an opening mounted on an exterior side of the housing for the cabinet. In an embodiment, the opening on the front side of the output socket mounted on a panel of the cabinet. The output socket may be operably connected to the sensor. The opening of the output socket may receive a cable plug for a cable connected to the external device. In addition, the method may comprise the step of generating, via the external device, an audible sound based on the detected signal. Accordingly, the electrical fault may be audibly monitored by an user of the external device.

Further, the method may comprise the step of generating, via the external device, a visual representation based on the detected signal. The external device may comprise a screen monitor, and may generate the visual representation on the screen monitor. As a result, the electrical fault may be visually monitored by the user of the external device. In some embodiments, the method may further comprise the step of detecting radiation emitted from the electrical components through the panel by the external device. The external device may comprise a screen monitor and generate a visual representation on the screen monitor based on the detected radiation. The visual representation may comprise a thermogram. Accordingly, the electrical fault may be visually monitored by an user of the external device.

In some embodiments of the present disclosure, a sensor may be mounted on an interior side of a housing for the electrical distribution equipment cabinet. The housing may enclose the electrical components located within the electrical distribution equipment cabinet. The sensor may detect a signal emitted from an electrical fault within the electrical distribution equipment cabinet. The sensor may comprise a transducer that may convert the detected signal to an electrical audio signal. In addition, an output connector may be mounted on the interior side of the housing for the electrical distribution equipment cabinet. The output connector may be operably connected to the transducer. The transducer may transmit the electrical audio signal to the output connector. The output connector may wirelessly transmit the electrical audio signal to an external device.

BRIEF DESCRIPTIONS OF THE DRAWINGS

The foregoing and other objects, features, and advantages for embodiments of the present disclosure will be apparent from the following more particular description of the embodiments as illustrated in the accompanying drawings, in which reference characters refer to the same parts throughout the various views. The drawings are not necessarily to scale, emphasis instead being placed upon illustrating principles of the present disclosure.

DESCRIPTION OF THE INVENTION

Reference will now be made in detail to the embodiments of the present disclosure, examples of which are illustrated in the accompanying drawings.

Embodiments of the present disclosure may enable electrical components and connections to be audibly monitored within an enclosure via an electrical fault detection device. A benefit of the present disclosure may include the detection of early warning signs of equipment failure. Another benefit may include electrical fault detection in order to conduct energy conservation audits. A further benefit may include the quick, safe and inexpensive inspection of electrical components and connections by personnel with minimal training. In addition, a benefit of the present disclosure may include the fast and accurate diagnosis of the partial discharge of electrical components and connections within electrical distribution equipment cabinets.

Figure 1:
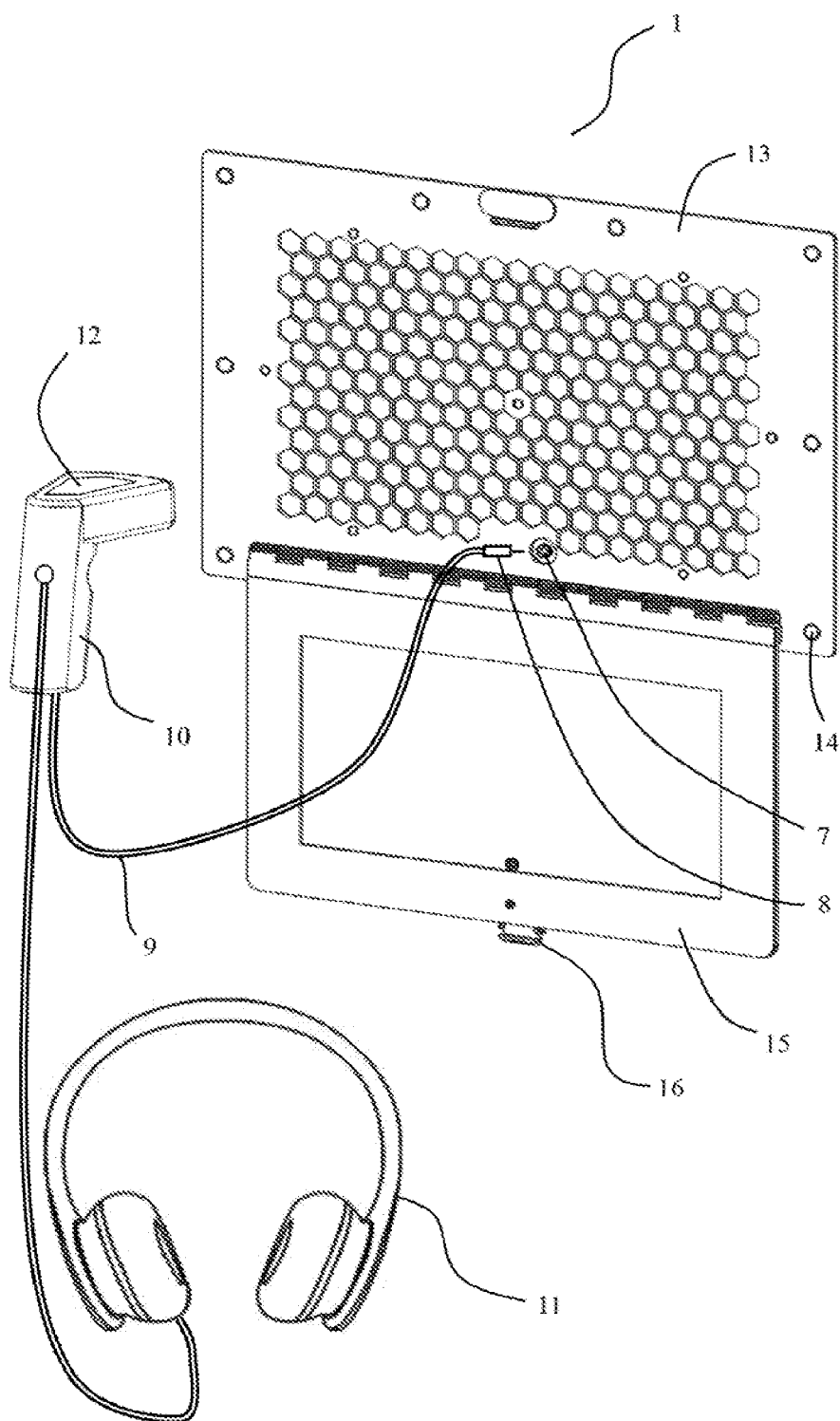
FIG. 1 is a diagram illustrating a perspective front view of an electrical distribution equipment cabinet panel with an output socket of an electrical fault detection device adapted to receive a cable plug of an external device that is connected to an audio device, in accordance with certain embodiments of the present disclosure.
Figure 2:
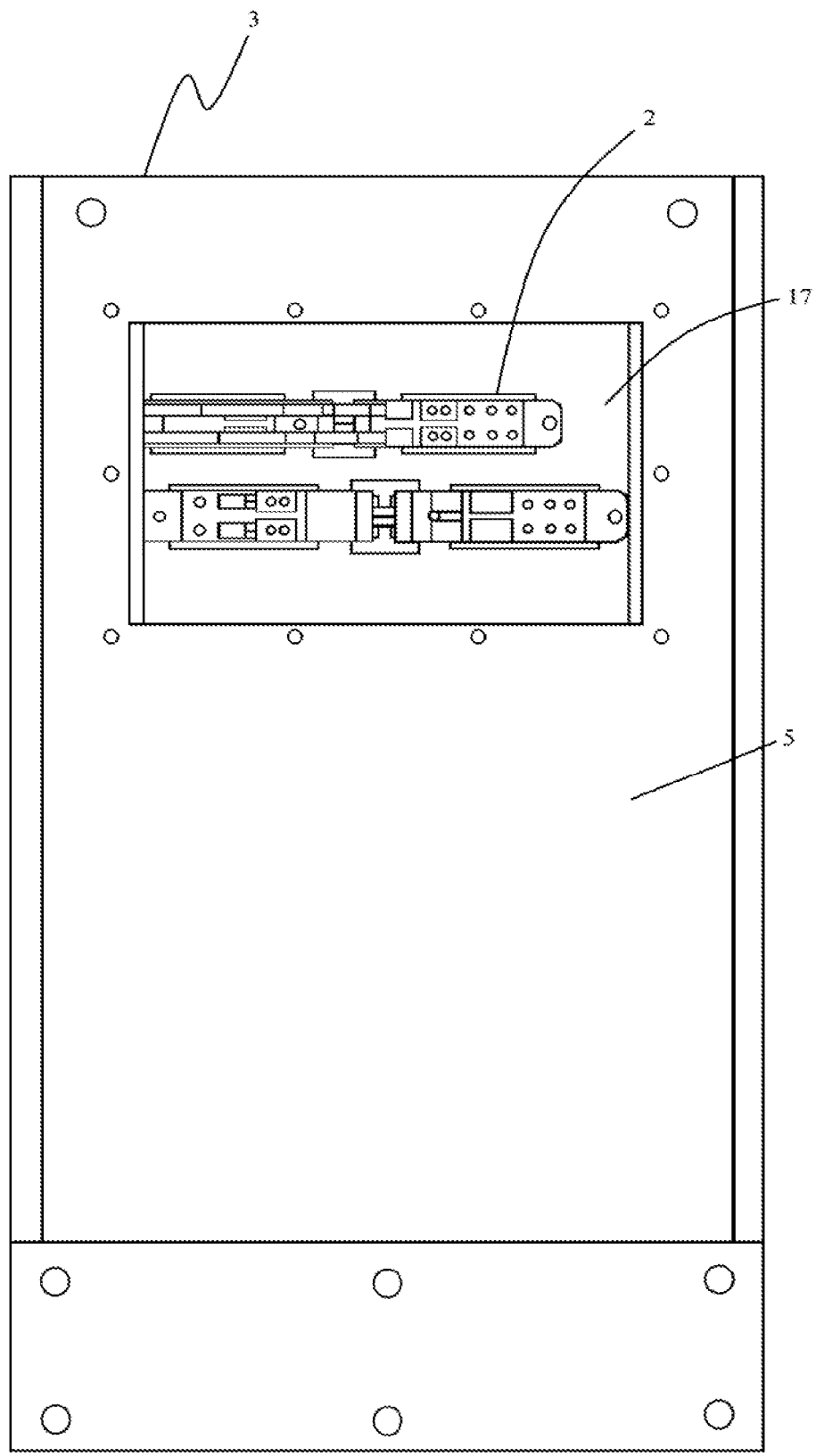
FIG. 2 is a diagram illustrating a front view of an electrical distribution equipment cabinet enclosing electrical components and having an opening adapted to receive a panel with an electrical fault detection device, in accordance with certain embodiments of the present disclosure.
Figure 3:
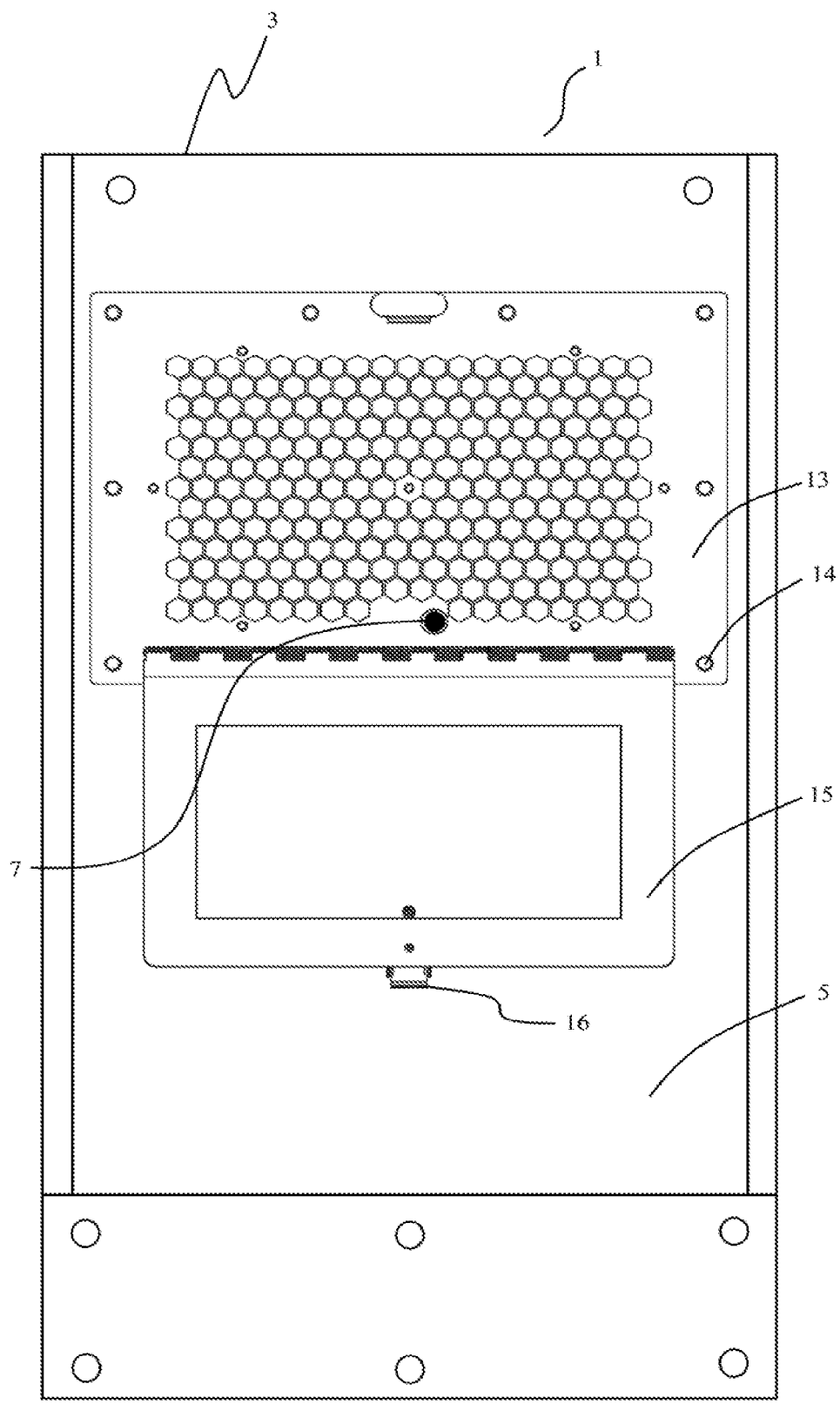
FIG. 3 is a diagram illustrating a front view of a panel with an output socket of an electrical fault detection mounted on an electrical distribution equipment cabinet via a retaining mechanism, in accordance with certain embodiments of the present disclosure.

FIG. 1 illustrates an embodiment of an electrical fault detection device 1 that enables that audible detection of an electrical fault within the electrical distribution equipment cabinet based on ultrasounds and electrical impulses emitted from the electrical fault. As shown in FIG. 2, electrical components 2 may be enclosed within an electrical distribution equipment cabinet 3. The electrical fault detection device 1 may be adapted to permit the audible monitoring of the electrical components 2 located within the electrical distribution equipment cabinet 3. The electrical components 2 may comprise electrical equipment, such as switchgear, switchboards, transformers, motor controls, and any electrical equipment mounted on panel boards of the cabinet 3. As shown in FIG. 3, the electrical fault detection device 1 may comprise a panel 13 mounted on the housing 5 for the electrical distribution equipment cabinet 3. The housing 5 may enclose the electrical components 2 that are located within the electrical distribution equipment cabinet 3.

Figure 5:
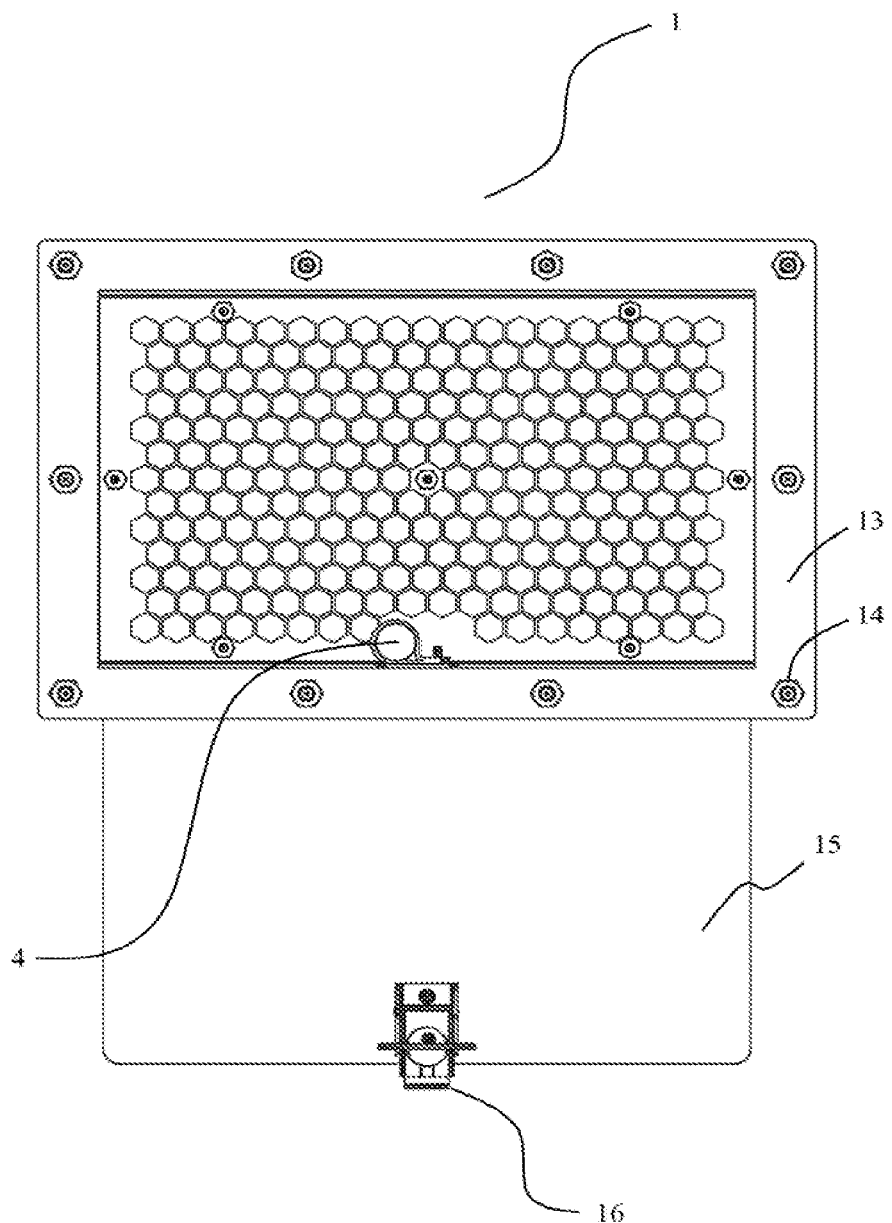
FIG. 5 is a diagram illustrating a rear view of an electrical distribution equipment cabinet panel with a sensor of an electrical fault detection device, in accordance with certain embodiments of the present disclosure.
Figure 6:
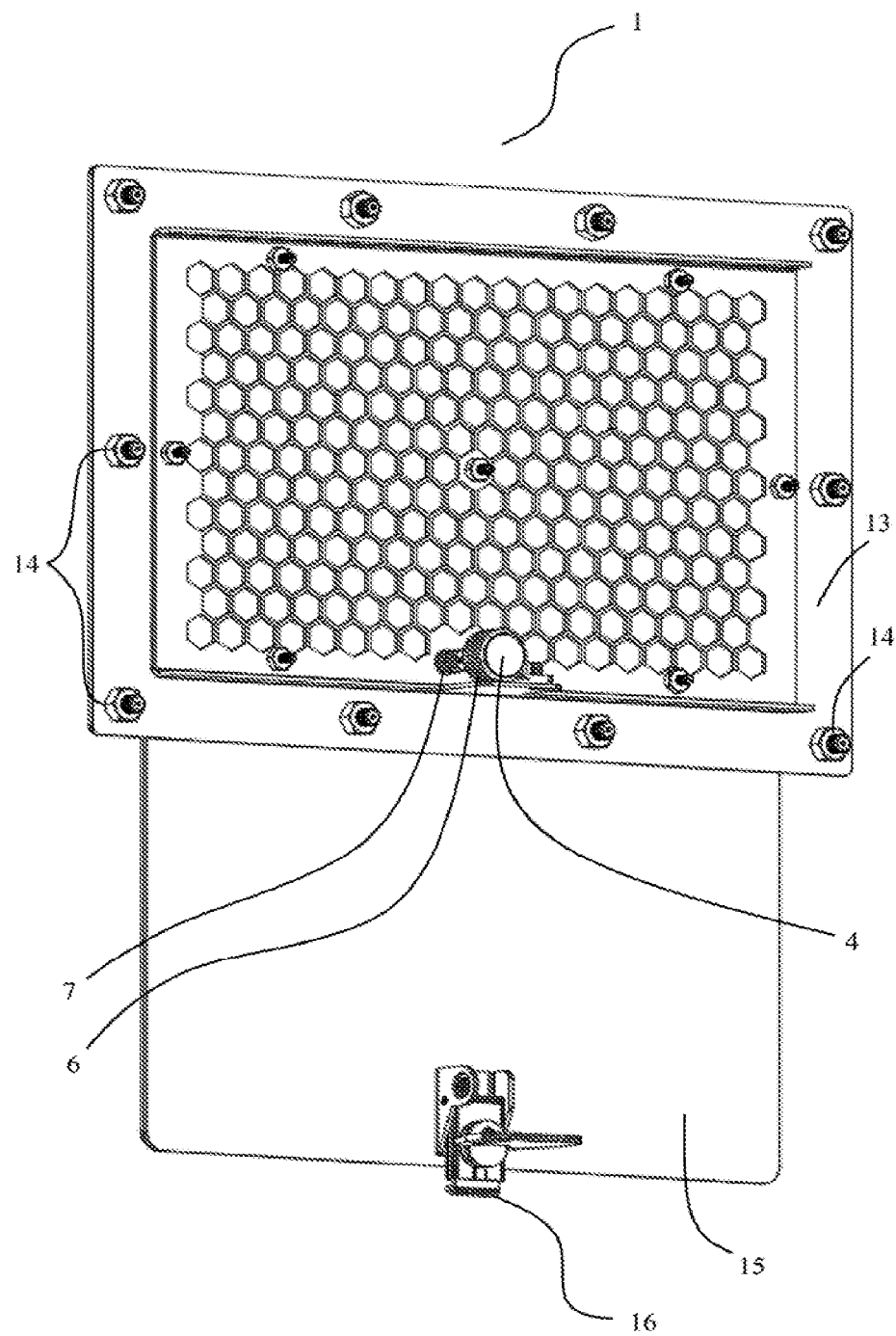
FIG. 6 is a diagram illustrating a perspective rear view of an electrical distribution equipment cabinet panel with a sensor and an output socket of an electrical fault detection device, in accordance with certain embodiments of the present disclosure.

The electrical fault detection device 1 may comprise a sensor/detector 4 (such as an ultrasound sensor) that may be mounted on the panel 13 in order to be positioned on the interior side of the housing 5 for the electrical distribution equipment cabinet 3, as illustrated in FIGS. 5-6. In an embodiment, the sensor 4 may be mounted on the housing 5 for the electrical distribution equipment cabinet 3 adjacent to the panel 13. The sensor 4 may be adapted to detect ultrasounds emitted from an electrical fault caused by a corona, arcing, surface tracking or partial discharge of an electrical component 2. The ultrasound signal may vary depending on the type of electrical fault (whether corona, arcing, surface tracking or partial discharge). The sensor 4 may also be adapted to detect voltage pulse changes or electrical impulses emitted from the electrical fault, including changes in electrical voltage and/or current. In such an embodiment, very high frequency (VHF) signals (e.g. within the frequency range of 156.0 and 174 MHz) resulting from an electrical fault may be detected by a sensor 4 via electric-field coupling or capacitive coupling. In certain embodiments where the electrical fault may be detected by a sensor 4 utilizing a VHF capacitive coupler, the detected signal may vary depending on the type of electrical fault. An electrical fault may be a partial discharge, an electric arc discharge, surface discharge and/or a corona discharge. In certain embodiments, the sensor 4 may detect transient earth voltage (TEV) signals generated by an internal partial discharge, as well as any other airborne emissions such as ultrasounds. Such a sensor 4 may be capable of detecting ultrasound frequencies and VHF, in accordance with some embodiments. The electrical fault detection device 1 may further comprise a converter 6 (such as a microcontroller/transducer/transmitter) that is connected to the detector or sensor 4. The converter or transducer 6 may be adapted to convert the detected ultrasound signals, and/or electrical impulse signals, into electrical audio signals and/or information/readings relating to the detected signals. In an embodiment, an electrical audio signal may correspond the detected signal and may be capable of generating a distinct audible sound that can be perceived by human ears so that an user may determine whether the detected signal resulted from a corona, arcing, surface tracking or partial discharge of an electrical component 2. In some embodiments, the transducer 6 and the sensor 4 may comprise a single unit or component.

Figure 4:
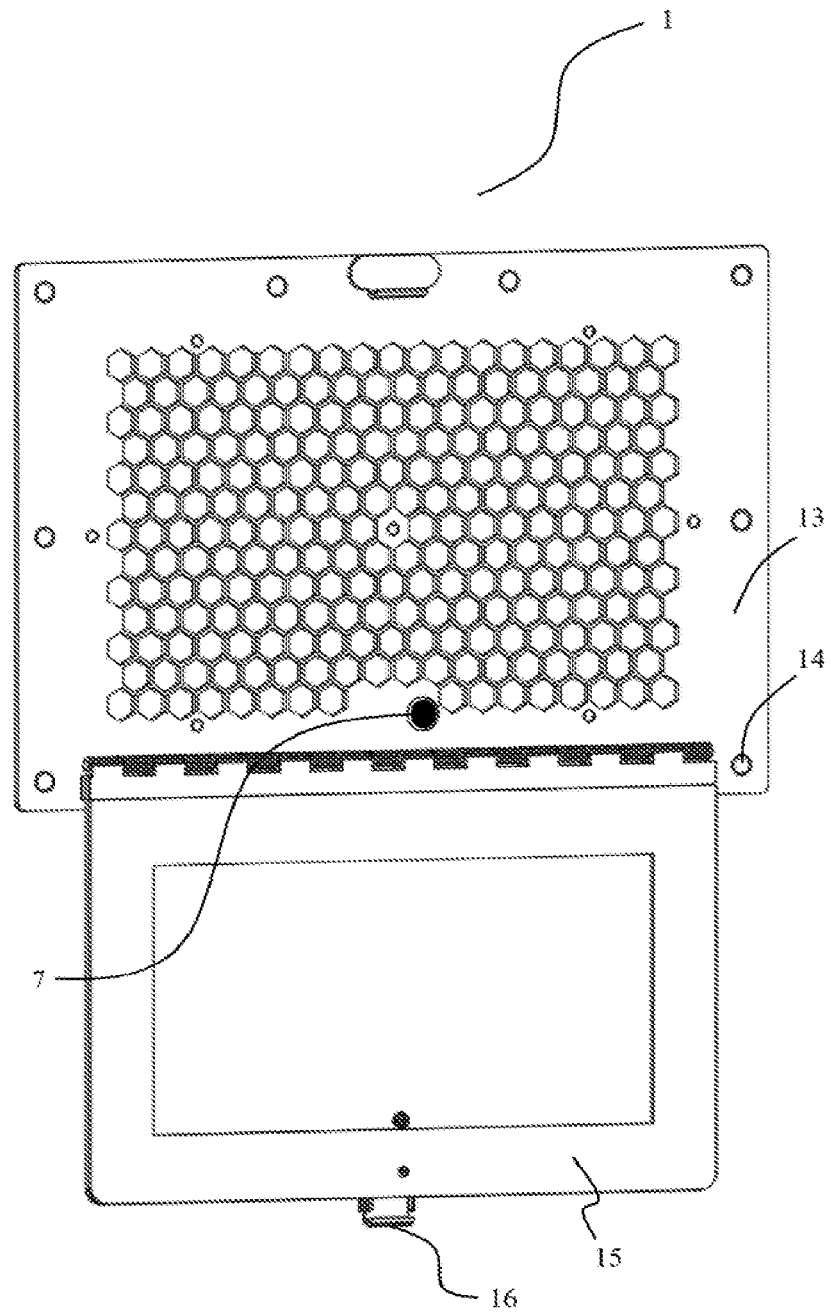
FIG. 4 is a diagram illustrating a perspective front view of an electrical distribution equipment cabinet panel with an output socket of an electrical fault detection device, in accordance with certain embodiments of the present disclosure.
Figure 7:
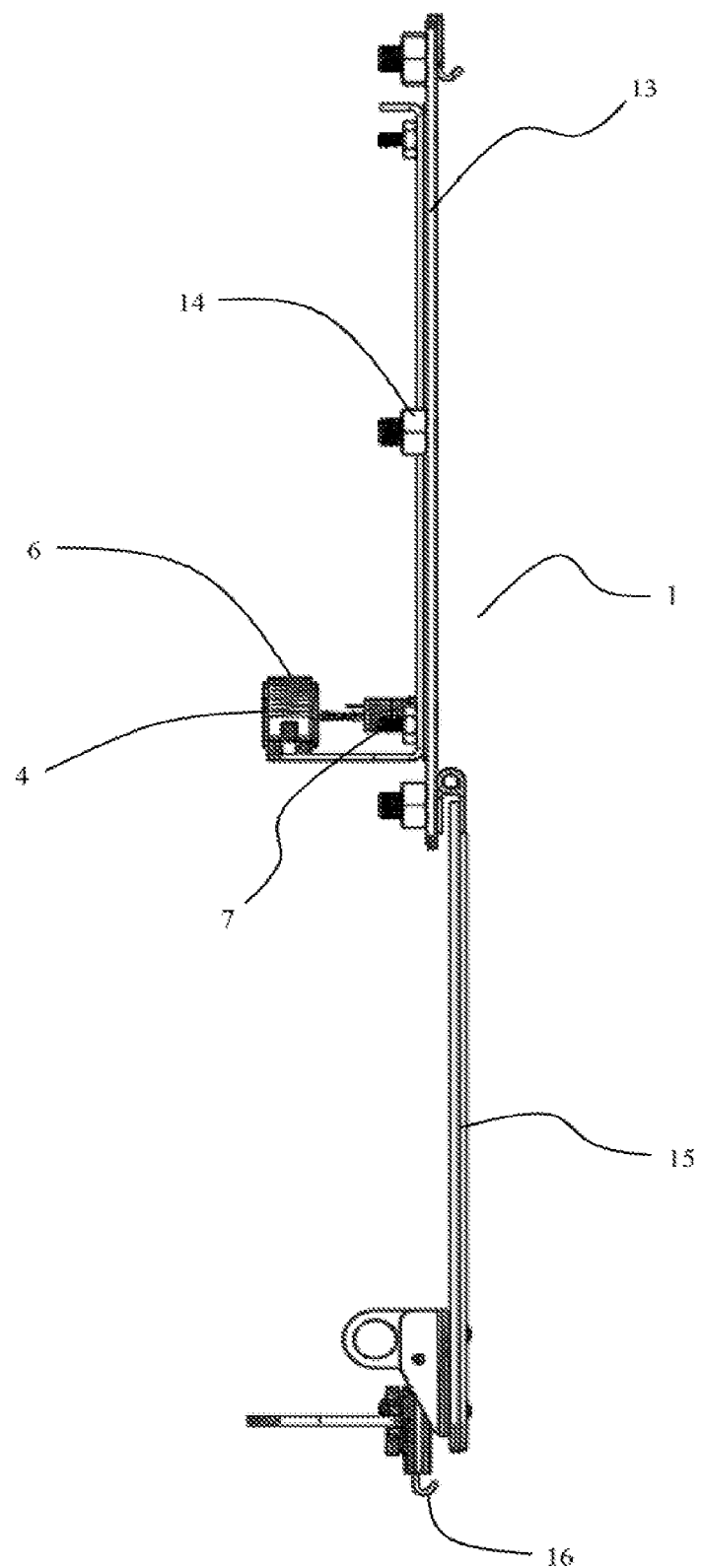
FIG. 7 is a diagram illustrating a side view of an electrical distribution equipment cabinet panel with a sensor and an output socket of an electrical fault detection device, in accordance with certain embodiments of the present disclosure.

An electrical fault detection device 1 may comprise an output socket or connector 7 (such as a headphone socket) mounted on the panel 13 in order to be positioned on the exterior side of the housing 5 for the electrical distribution equipment cabinet 3, as shown in FIGS. 3-4. In an embodiment, the socket 7 may be mounted on the housing 5 for the electrical distribution equipment cabinet 3 adjacent to the panel 13. As further illustrated in FIGS. 7 and 11, the output socket 7 may be connected via electrical wires to the transducer 6 and may receive the electrical audio signals from the transducer 6. The output socket 7 may be connected directly to the sensor 4 via electrical wires or cables and may receive the detected signals (such as ultrasounds, electromagnetic pulses, electrical impulses, VHF signals and TEV signals) from the sensor 4, in accordance with some embodiments. In an embodiment, the sensor 4 may detect such signals using capacitive coupled transducers 6. In some embodiments, the sensor 4 may comprise a transducer 6 capable of detecting both ultrasounds and TEV signals.

Figure 9:
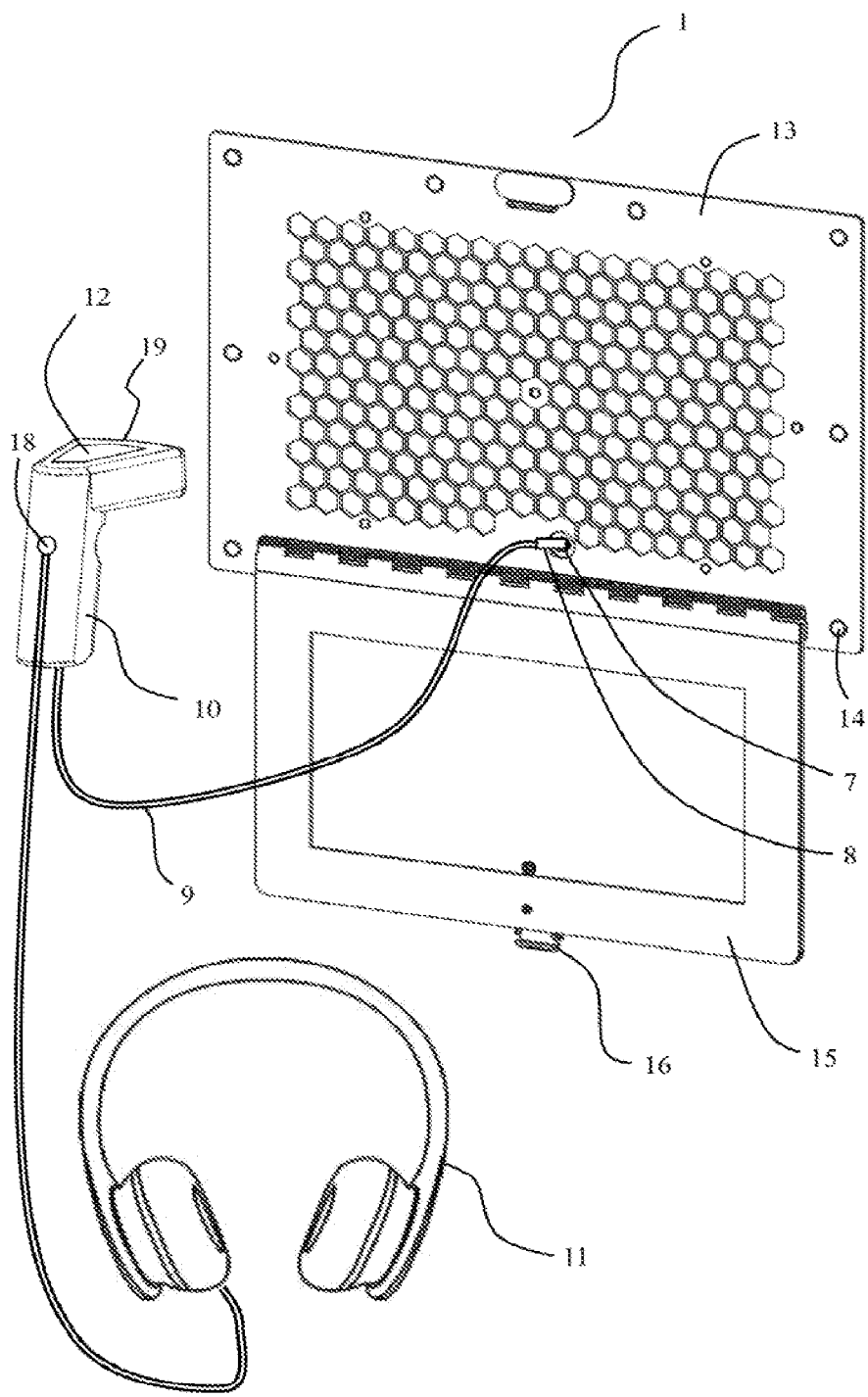
FIG. 9 is a diagram illustrating a perspective front view of an electrical distribution equipment cabinet panel with an external device plugged into an output socket of an electrical fault detection device and connected to an audio device, in accordance with certain embodiments of the present disclosure.

Referring back to FIG. 1, the output socket 7 may be adapted to receive a cable plug or jack 8 (such a 3.5 mm female jack) of an electrical cable/wire 9 connected to an external device 10. In accordance with certain embodiments, the output socket 7 may be adapted to transmit the electrical audio signals and/or the detected signals to the external device 10 via the electrical cable/wire 9. The external device 10 may be adapted to generate an audible sound based on the electrical audio signals. In some embodiments, the external device 10 may comprise a headphone, a headset, or a speaker. In certain embodiments, the external device 10 may be adapted to connect to an audio device 11 capable of generating an audible sound. As shown in FIG. 9, the external device 10 may comprise a headphone jack socket 18 for the audio device 11 (e.g. headphones). The audio device 11 may be capable of generating an audible sound based on the detected signals. In certain embodiments, ultrasounds and/or partial discharges of an electrical component 2 may be audibly perceived and monitored by an user of the external device 10. Accordingly, the user may identify the existence of an electrical fault without having a direct line of sight to the electrical component 2 having the partial discharge. In an embodiment, the output connector 7 may comprise a wireless transmitter capable of wirelessly transmitting (e.g. via Bluetooth or Wi-Fi technology) the detected signals and/or the electrical audio signals to an external device 10 that is adapted to wirelessly receive such signals.

In some embodiments, the external device 10 may comprise a device that is capable of analyzing ultrasounds and/or pulse discharges detected by a sensor. The external device 10 may analyze information and data relating from the detected signals, in accordance with certain embodiments. The external device 10 may collect and track such information/data. In some embodiments, the information/data may be transmitted to a computer or server for a further analysis. The external device 10 may comprise an electrical cable or wire having a cable plug/jack adapted to be plugged into the output socket 7 that may be connected to the sensor 4. In an embodiment, the sensor 4 may detect electrical signals, light wave signals and/or sound wave signals emitted from an electrical fault within the electrical distribution equipment cabinet 3. In such an embodiment, the sensor 4 may comprise a transducer 6 capable of detecting ultrasounds and TEV signals via capacitive coupling technology. These signals, or electrical signals converted by a transducer 6 based on such detected signals, may be transmitted via the output socket 7 to the external device 10. In certain embodiments, the sensor 4 may comprise the transducer 6 that converts the detected signals into electrical audio signals. In an embodiment, the detected signals may be converted into electrical audio signals by the external device 10.

The external device 10 may also comprise a screen monitor 12, as shown in FIG. 9. In some embodiments, the external device 10 may convert the detected signals and/or the electrical audio signals into visual expressions that may be displayed on the screen monitor 12. The screen monitor 12 may display information relating to the detected signals, including without limitation partial discharge readings, voltage readings, electrical current readings, sound level readings (including decibel levels), and sinusoidal wave representations of the detected signals. Accordingly, an user of the external device 10 may monitor the electrical components 2 located within the cabinet 3 for an electrical fault by viewing the screen monitor 12 and by listening to the audio device 11. In an embodiment, the external device 10 may operate in multiple modes. In one mode, ultrasounds may be detected and the screen monitor 12 may display a visual representation comprising sound level readings. In another mode, electrical impulses (e.g. TEV signals) may be detected via capacitive coupling technology and the screen monitor 12 may display a visual representation comprising voltage impulse readings and/or sound level readings.

In an embodiment of a method for the audible monitoring of electrical components 2 in an electrical distribution equipment cabinet 3, the method may comprise the detection of signals (such as ultrasounds and/or electrical impulses) emitted from a partial discharge of an electrical component 2 located within the electrical distribution equipment cabinet 3. The detection may be performed by an ultrasound sensor 4. The sensor or detector 4 may be mounted on the interior side of a housing 5 for the electrical distribution equipment cabinet 3. In certain embodiment, multiple sensors 4 may be mounted in order to monitor additional areas within the cabinet 3. The method may further comprise the conversion of the detected signals to electrical audio signals. The conversion may be performed by a converter 6 such as a microcontroller, a transducer or a transmitter. A transducer 6 may be connected to the sensor 4. In addition, the method may comprise the transmission of the audible signals to an exterior device 9 via an output socket 7. The output socket 7 may be mounted on the exterior side of the housing 5 for the electrical distribution equipment cabinet 3. The output socket 7 may be adapted to receive a cable plug/jack for a cable connected to the external device 10. Further, the method may comprise the generation of an audible sound based on the detected signals. The sound production may be performed by the external device 10. In some embodiments, the transducer 6 and the sensor 4 may comprise a single unit or component. In certain embodiments, ultrasounds and partial discharges of an electrical component 2 may be audibly perceived and monitored by an user via the external device 10. Accordingly, the user of the presently disclosed method may identify the existence of an electrical fault, such a partial discharge.

In an embodiment, an electrical fault detection device 1 may be located adjacent to the targeted area where the monitored electrical components 2 are located within the cabinet 3. In an embodiment, the electrical fault detection device 1 may comprise a panel 13 for the housing 5 of the cabinet 3 that is interchangeable with filler or blanking panels located adjacent to the targeted area. The sensor 4, transducer 6 and output socket 7 may be mounted on the panel 13. In certain embodiments, a preexisting blanking panel may be altered or adapted to include an electrical fault detection device 1. In an embodiment, a panel 13 for the electrical fault detection device 1 may comprise a polymeric material that is transparent to infrared radiation (IR) and/or ultraviolet (UV) radiation for the infrared, ultraviolet and/or visual inspection of the electrical components 2. In certain embodiments, the panel 13 may comprise an array of holes or ports formed therethrough that permit infrared inspection through the panel 13 from the outside of the housing 5 of the cabinet 3. In some embodiments, the external device 10 may comprise a camera or detection thermographer (such as an infrared camera) that is capable of imaging the radiation emitted from an electrical component 2. As shown in FIG. 9, the front end 19 of the external device 10 comprises the lens for such a thermographer. In an embodiment, the external device 10 may operate in a thermographer mode. Radiation that is emitted from an electrical component and through the IR/UV-permitting panel 13 may be detected via the external device 10, and the screen monitor 12 may display a visual representation comprising temperature measurements, a thermogram or an infrared image that shows the patterns of heat.

A benefit of the present disclosure may include an improved inspection of electrical components 2 within an electrical distribution equipment cabinet 3 via the audible and visual detection of early warning signs of equipment failure. Accordingly, an advantage of the present disclosure may include an inspection of an electrical distribution equipment cabinet 3, which is enclosed for safety concerns in light of the high voltage of the power source, through an user's sight and hearing senses. In addition, the placement of the sensor 4 on the interior side of the cabinet 3 proves an improvement in the detection of signals emitted from the electrical components 2. Further, the configuration of an output socket or connector 7 connected to the sensor 4 and mounted on the panel 13 improves the processing efficiency for the monitoring of electrical faults.

Figure 8:
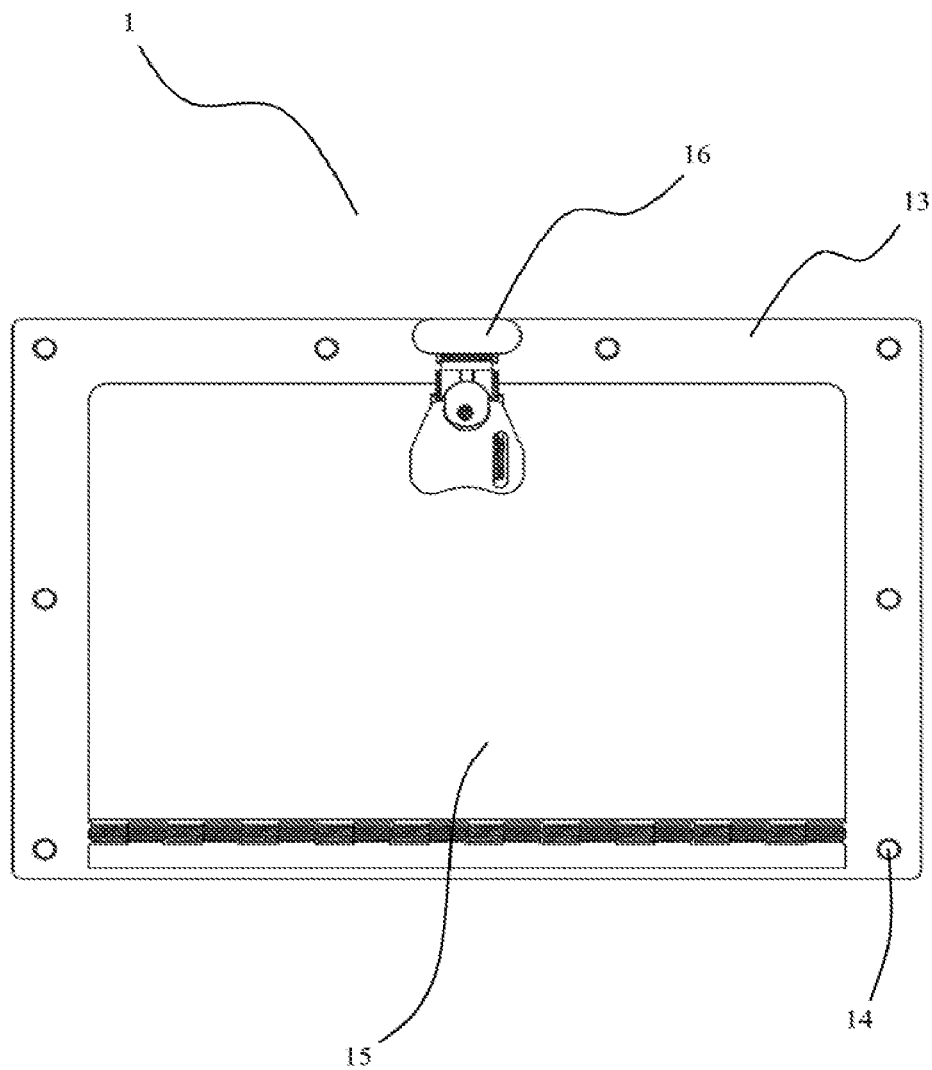
FIG. 8 is a diagram illustrating a front view of an electrical distribution equipment cabinet panel with a lid in a closed position over an electrical fault detection device, in accordance with certain embodiments of the present disclosure.

In some embodiments, a retaining mechanism 14 that may be adapted to mount a panel 13 to the housing 5 for the electrical distribution equipment cabinet 3. As shown in FIG. 2, the housing 5 for the cabinet 3 may define an opening 17 adapted to receive such a panel 13 having the electrical fault detection device 1. In accordance with certain embodiments, a preexisting electrical distribution equipment cabinet 3 may be modified to include an electrical fault detection device 1 by mounting such a panel 13 over an opening 17 in the housing 5 of a cabinet 3. This provides the benefit of adding an electrical fault detection device 1 without replacing the cabinet 3 or substantively altering the structure of the cabinet 3. In some circumstances, it may not be acceptable to power-off systems due to unwanted interruptions to downstream equipment. In addition, certain power distribution systems may not be readily altered due to safety concerns in light of the high voltage of the power source. As shown in FIG. 8, the electrical fault detection device 1 may comprise a closure 15 (such as a door, plate or lid) for covering the output socket 7 when the electrical components 2 are not actively being monitored. The closure 15 may be locked by a latch 16.

Figure 10:
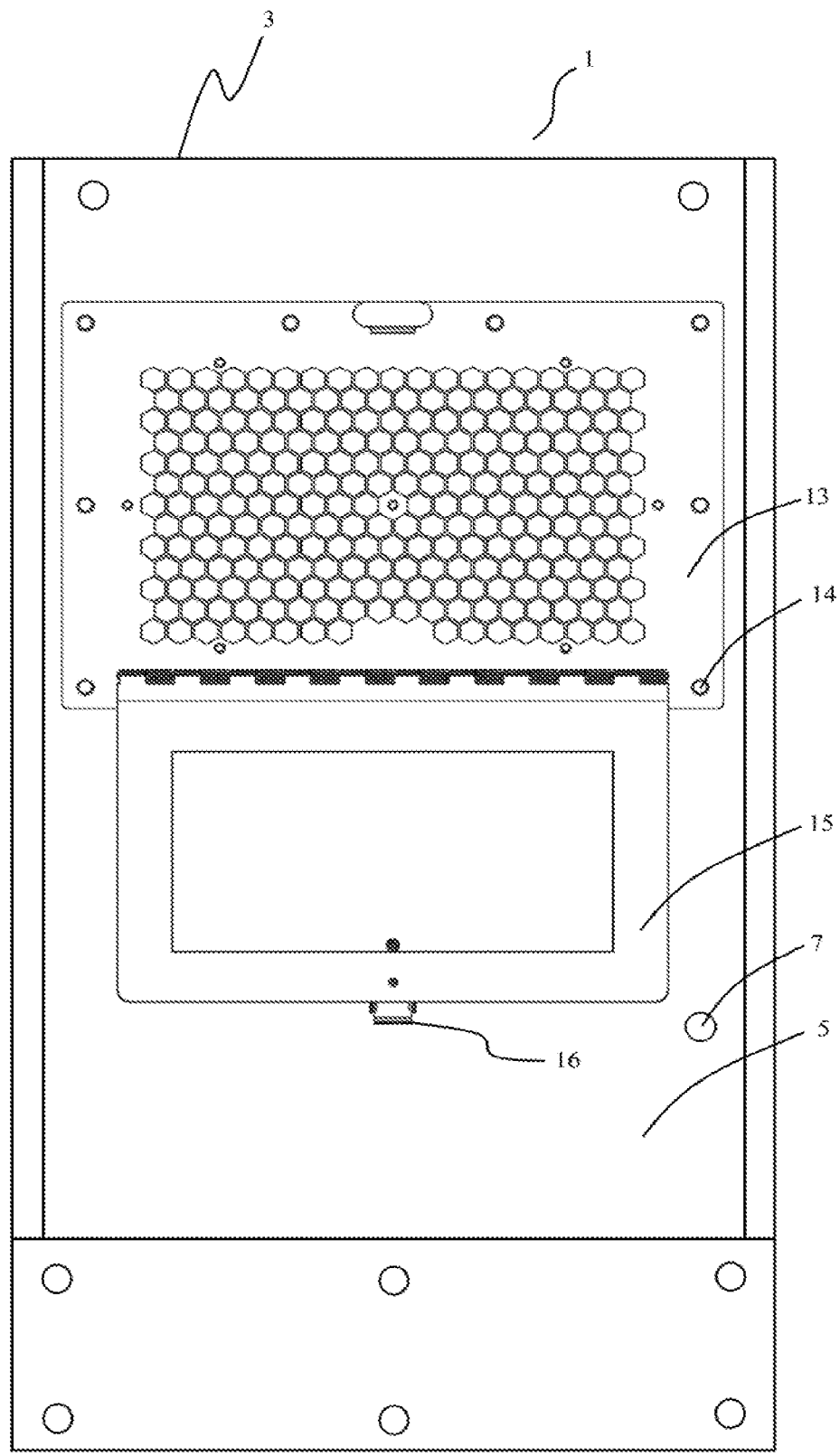
FIG. 10 is a diagram illustrating a front view of an output socket of an electrical fault detection mounted on an electrical distribution equipment cabinet adjacent to a panel, in accordance with certain embodiments of the present disclosure.
Figure 11:
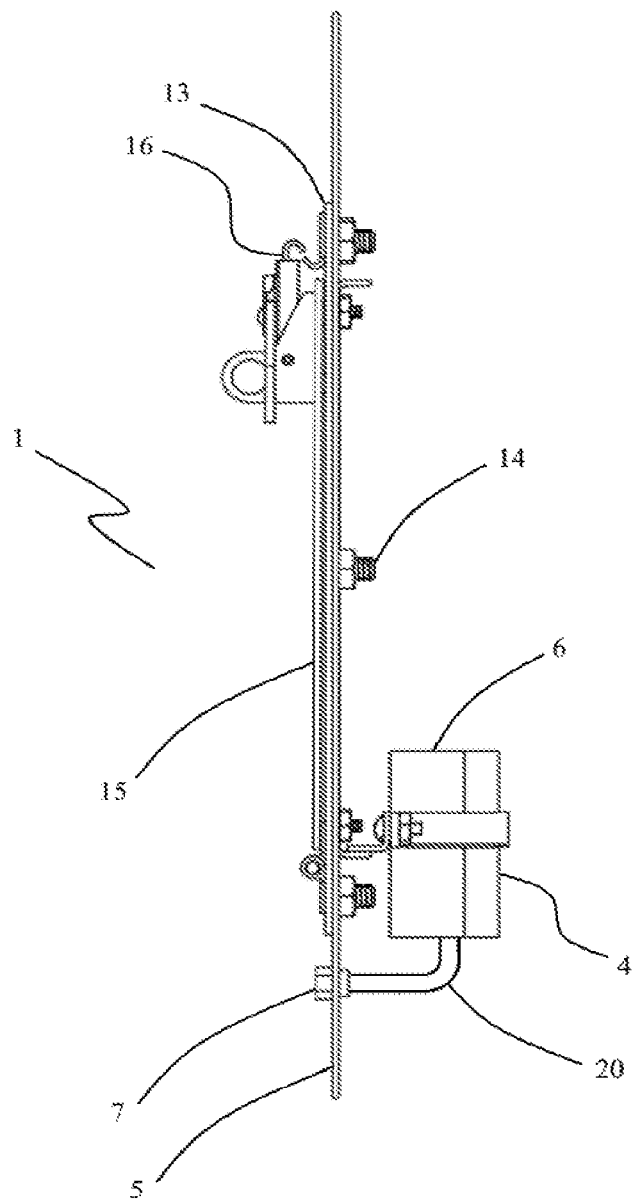
FIG. 11 is a diagram illustrating a side view of an output socket of an electrical fault detection mounted on an electrical distribution equipment cabinet adjacent to a panel with a sensor, in accordance with certain embodiments of the present disclosure.

As shown in FIGS. 10 and 11, in accordance with certain embodiments, the output socket 7 may be mounted on the housing 5 for an electrical distribution equipment cabinet 3 adjacent to the IR/UV-permitting panel 13. In some embodiment, the output socket 7 may be connected to the sensor 4 via a coaxial cable 20 adapted to transmit detected signals and/or the electrical audio signals. In an embodiment, the coaxial cable 20 may transmit electrical audio signals corresponding to the detected ultrasound signals and/or the electrical impulses (such as VHF signals) detected by a sensor 4 via electric-field coupling or capacitive. In some embodiments, an advantage of the present disclosure may include the monitoring of electrical components 2 within an electrical distribution equipment cabinet 3 by detecting ultrasounds, electrical impulses and IR radiation emitted from an electrical fault. The detection of an ultrasound, an electrical impulse and IR radiation may improve the identification of the location of the electrical fault within the cabinet 3. In some embodiments, an advantage may include the positioning of the sensor 4 on the interior side of the cabinet 3 in order to improve the detection of the signals emitted by an electrical fault. Accordingly, a benefit may further include an improvement in the quality of the electrical audio signals and audible sounds that are generated based on such detected signals in order to enable an user to better perceive a distinction between the types of electrical faults. In an embodiment, these improvements may benefit the detection of early warning signs of equipment failure through the identification of the location and type of an electrical fault.

While the present disclosure has been particularly shown and described with reference to certain embodiments, it will be understood by those skilled in the art that various changes in form and details may be made therein without departing from the spirit and scope of the disclosure, particularly in light of the foregoing teaching. It is therefore contemplated by the appended claims to cover such modifications and incorporate features that come within the spirit and scope of the disclosure.

What is claimed is:

1. A method, comprising:
    positioning a panel on a cabinet, the cabinet comprising one or more electrical components located within the cabinet, the panel comprising:
        a first side that faces into an interior of the cabinet;
        a second side that faces away from the interior of the cabinet;
        a sensor positioned on the first side of the panel, the sensor adapted to detect a signal emitted from an electrical fault within the cabinet; and
        an output socket comprising an opening that is positioned on the second side of the panel, the opening adapted to receive a cable plug for a cable connectable to an external device, the output socket operably connected to the sensor; and
    securing the panel to the cabinet via a retaining mechanism.

2. The method of claim 1, further comprising:
    detecting, via the sensor, the signal emitted from the electrical fault within the cabinet;
    transmitting, via the output socket, the detected signal to the external device; and
    generating an audible sound based on the detected signal, whereby the electrical fault may be audibly monitored by a user.

3. The method of claim 1, wherein the sensor is an ultrasound sensor.

4. The method of claim 1, wherein the sensor is a partial discharge detector.

5. The method of claim 1, wherein the external device is selected from a group consisting of: a headphone, a headset, and a speaker.

6. The method of claim 1, wherein the external device is adapted to connect to an audio device, wherein the audio device is selected from a group consisting of: a headphone, a headset, and a speaker.

7. The method of claim 1, wherein the panel comprises an array of holes adapted for a visual inspection from outside of the cabinet of the electrical fault located within the cabinet.

8. The method of claim 1, wherein securing the panel to the cabinet via a retaining mechanism comprises securing the panel to the cabinet via screws and nuts.

9. The method of claim 1, wherein the panel is transparent to radiation emitted from the one or more electrical components.

10. An electrical fault detection device for monitoring one or more electrical components located within a cabinet, comprising:
    a panel mountable on the cabinet via a retaining mechanism, wherein, when mounted on the cabinet, the panel comprises a first side that faces into an interior of the cabinet and further comprises a second side that faces away from the interior of the cabinet;
    a sensor positioned on the first side of the panel, the sensor adapted to detect a signal emitted from an electrical fault within the cabinet; and
    an output socket comprising an opening that is positioned on the second side of the panel, the opening adapted to receive a cable plug for a cable connectable to an external device, the output socket operably connected to the sensor.

11. The device of claim 10, wherein the sensor is adapted to transmit the detected signal to the output socket, the output socket is adapted to transmit the detected signal to the external device via the cable, the external device is adapted to generate an audible sound based on the detected signal, whereby the electrical fault may be audibly monitored by a user, and wherein the external device is selected from a group consisting of: a headphone, a headset, and a speaker.

12. The device of claim 10, wherein the external device is adapted to connect to an audio device, the sensor is adapted to transmit the detected signal to the output socket, the output socket is adapted to transmit the detected signal to the external device via the cable, the external device is further adapted to transmit the detected signal to the audio device, the audio device is adapted to generate an audible sound based on the detected signal, whereby the electrical fault may be audibly monitored by a user, and wherein the audio device is selected from a group consisting of: a headphone, a headset, and a speaker.

13. The device of claim 10, wherein the external device comprises a screen monitor, the external device is adapted to generate a visual representation on the screen monitor based on the detected signal, whereby the electrical fault may be visually monitored by a user, and wherein the visual representation comprises information selected from a group consisting of: partial discharge readings, voltage readings, electrical current readings, sound level readings, and sinusoidal wave representations.

14. The device of claim 10, wherein the electrical fault is selected from a group consisting of: corona, arcing, surface tracking and partial discharge of the one or more electrical components.

15. The device of claim 10, wherein the sensor is an ultrasound sensor.

16. The device of claim 10, wherein the sensor is a partial discharge detector.

17. The device of claim 10, wherein the panel is transparent to radiation emitted from the electrical fault.

18. The device of claim 10, wherein the panel comprises an array of holes adapted for a visual inspection from outside of the cabinet of the electrical fault located within the cabinet.

19. The device of claim 10, wherein the retaining mechanism comprises screws and nuts.

\* \* \* \* \*